(12) United States Patent
Tomaiuolo et al.

(10) Patent No.: US 6,372,027 B1
(45) Date of Patent: Apr. 16, 2002

(54) PROCESS FOR PROMOTING ADHESION BETWEEN AN INORGANIC SUBSTRATE AND AN ORGANIC POLYMER

(75) Inventors: Francesco Tomaiuolo, Trofarello; Riccardo Ottria, Capriata d'Orba, both of (IT)

(73) Assignee: Alfachimici S.p.A., Moncalieri (IT)

( * ) Notice: Subject to any disclaimer, the term of this patent is extended or adjusted under 35 U.S.C. 154(b) by 0 days.

(21) Appl. No.: 09/583,915

(22) Filed: May 31, 2000

(30) Foreign Application Priority Data

May 31, 1999 (IT) .......................... TO99A0456

(51) Int. Cl.$^7$ .............................. B05D 5/12; C23L 28/00
(52) U.S. Cl. ................................. 106/14.42; 106/287.2; 106/287.21; 252/79.1; 252/79.4; 427/96; 427/98; 427/327; 148/269; 148/274; 216/13; 216/106; 216/108
(58) Field of Search .............................. 252/79.1, 79.4; 106/14.42, 287.2, 287.21; 427/96, 98, 327; 148/269, 274; 216/13, 106, 108

(56) References Cited

U.S. PATENT DOCUMENTS

| 5,622,782 | A |   | 4/1997  | Poutasse, III et al.      |
|-----------|---|---|---------|---------------------------|
| 5,700,362 | A |   | 12/1997 | Yano et al.               |
| 5,800,859 | A |   | 9/1998  | Price et al.              |
| 5,925,174 | A | * | 7/1999  | Aoyama et al. ... 106/14.42 |
| 6,036,758 | A | * | 3/2000  | Fairweather ... 106/14.44 |
| 6,284,309 | B1| * | 9/2001  | Bishop et al. ... 427/98  |

FOREIGN PATENT DOCUMENTS

| EP | 0890660 A1 | 1/1999 |
| JP | 7258870 | 10/1995 |
| JP | 10256727 | 9/1998 |
| WO | WO 9636747 | 11/1996 |

OTHER PUBLICATIONS

Xue et al., "The Coupling Mechanism of Benzotriazole Pre–treated Copper and Epoxy Resin", *Die Angewandte Makromolekulare Chemie* 188 (1991) 51–61 (No. 3090), No Month Provided.

* cited by examiner

*Primary Examiner*—David Brunsman
(74) *Attorney, Agent, or Firm*—Young & Thompson

(57) ABSTRACT

The invention relates to a process, and compositions for its implementation, to promote adhesion between an inorganic substrate and an organic polymer, especially between the copper surfaces of printed circuits for electronic use and a polymer resin, in which an organometallic layer of a dark brown colour, which is very uniform and compact, is deposited on the inorganic substrate by means of treatment in a composition which comprises:

a) a silane or a mixture of functional organic silanes with a structure represented by the following general formula: $Y$—$(CH_2)_n$—$Si(OR)_3$ where: Y represents a functional organic group, n is a number which has a value between 0 and 3, and R represents a hydrogen atom or any easily hydrolysable group which is capable of releasing an atom of hydrogen b) an azole compound;

c) an oxygen carrier;

d) an organic or inorganic acid; and preferably e) a zinc compound.

40 Claims, No Drawings

PROCESS FOR PROMOTING ADHESION BETWEEN AN INORGANIC SUBSTRATE AND AN ORGANIC POLYMER

BACKGROUND OF THE INVENTION

This invention relates to a process and compositions for promoting adhesion between an inorganic substrate and an organic polymer. The invention mainly finds application in the manufacture of printed circuits for electronic use. More particularly, the invention relates to a process for promoting adhesion between the copper surfaces of printed circuits and a polymer resin.

Printed circuits have been used for a long time in the manufacture of electronic equipment. Printed circuits constitute the background to electronic components and ensure the necessary interconnections between components.

Printed circuits comprise a polymer substrate, generally formed from a glass fibre reinforced epoxy resin, or a phenol, polyamide, polyester or teflon resin or other resins, covered with thin sheets of copper on one or both outer surfaces.

The pattern of the circuit is constructed by protecting some areas of the copper sheet with a layer of organic polymer (known as a photoresist) and removing copper from those areas which are not protected using an etching treatment.

With this process it is possible to obtain single-sided and double-sided circuits which offer a rather limited density of interconnections. In order to overcome this limitation multilayer printed circuits are currently widely in use.

In the manufacture of multilayer printed circuits, circuits with two thin surfaces (known as internal layers) are prepared, and are then stacked, separating them with layers of a dielectric consisting of an only partly polymerized resin (known as a prepreg), and then laminated under the combined action of pressure and heat. Multilayer printed circuits obtained in this way have various circuit planes contained within them, and are therefore able to provide a high density of interconnections. The conductive elements of the various circuit planes are connected together by making a suitable grid of interconnection holes which may be through-holes, blind holes or embedded holes; the latter only connect internal layers with each other, but are always constructed before the stacked layers are laminated. The holes are subjected to a chemical cleaning treatment (known as desmearing) to remove the drilling residues present on the hole walls and in particular on the internal layers of copper. Subsequently the walls of the holes are coated with metal, thus making the electrical connections between the different planes in the multilayer circuit.

A typical problem with multilayer circuits is that of possible delamination between the copper surfaces in the conducting patterns of the internal layers and the layers of resin in the dielectric. In order to overcome this problem by promoting adhesion between copper and the resin, copper oxide has been used as a promoter of adhesion for many years. Processes which make it possible to obtain "black oxide" and "brown oxide" are commercially available. These processes use solutions based on sodium chlorite and sodium hydroxide, at high temperatures. With these processes a very porous layer of copper oxide is obtained, characterized by a high surface area. During the stage of laminating a multilayer circuit, the layer of oxide interacts with the resin of the dielectric ensuring high adhesion and thus preventing subsequent delamination problems. Depending on the type of process used it is possible to obtain delamination resistance values (known as peel strength) of between 0.5 and 1 kg/cm. In particular brown oxide makes it possible for greater adhesion to be obtained and is therefore the more widely used.

The first patents describing a process for obtaining black oxide, for decorative purposes, are U.S. Pat. Nos. 2,364,993, 2,460,896 and 2,481,854. The application of copper oxide in the field of printed circuits has been described in various patents, e.g. in U.S. Pat. Nos. 2,955,974 and 3,374,129.

Although copper oxide is able to overcome the problems of delamination, its use in the manufacture of multilayer circuits is not however problem-free, the most important of these problems being known as "pink ring". Multilayer printed circuits are subjected to high mechanical stresses during drilling and this causes microdelamination in the areas surrounding the holes, at the interface between the oxidized copper surface and the layer of dielectric. During subsequent treatments for cleaning the hole walls (desmearing) and depositing copper using chemical and electrolytic means, the hole walls come into contact with acid solutions which seep by capillarity into those areas where microdelamination has occurred and cause the layer of oxide, which is soluble in acids, to be dissolved. Dissolution of the oxide layer in the areas surrounding the holes exposes the surface of the underlying copper, which is of a pink colour, hence the name "pink ring" given to this phenomenon.

Pink ring is often only an aesthetic problem, but sometimes it also constitutes a functional problem. In any case it is a very serious problem, as multilayer circuits showing evidence of this problem are commercially regarded as scrap. The pink ring problem is very difficult to control; by operating on various parameters in the process for the production of multilayer circuits the problem can sometimes be minimized, but it cannot be eliminated. Also, occasionally and without any possibility of control, pink ring can occur to an extent which is unacceptable.

Various processes which in general provide for the use of reducing and alkaline solutions which are capable of reducing copper oxide to cuprous oxide and/or copper metal, which are insoluble in acids, have been proposed in order to overcome the pink ring problem. In particular, a process described in U.S. Pat. No. 4,642,161, which provides for the use of aqueous aminoborane solutions, in particular dimethyl aminoborane, which make it possible to reduce copper oxide to metallic copper, is widely used. This process is effectively able to eliminate the pink ring problem and greatly increase adhesion between the copper surfaces and the polymer resin layer. In the case of epoxy resin it is possible with this procedure to obtain peel strength values of between 1 and 1.5 kg/cm. This process does however have some disadvantages. The first disadvantage lies in the fact that it is quite a complex process, which requires many treatments. The second disadvantage lies in the difficulty of controlling the process, given that the copper oxide reduction reaction involves very variable times depending upon the design of the circuit. The final and most serious disadvantage lies in the very high cost of this process.

Processes which provide for the use of alternative less costly reducing agents are described in European patent applications nos. 0,321,067 and 0,402,966 and in U.S. Pat. Nos. 4,997,516, 5,492,595 and 5,753,309, but for various reasons these processes have not found industrial application.

Recently, alternative processes have been proposed with a view to promoting adhesion, and these are essentially microetching processes capable of ensuring high surface microroughness on the copper surfaces. These processes make it possible to obtain appreciable adhesion and above all to eliminate the pink ring problem. The adhesion thus obtained is not very great, but for not particularly critical applications it is sufficient to avoid problems of delamination between the copper surfaces and the layer of polymer resin. In addition to their low cost, these processes have the great advantage that they are quite simple and can be used in a conveyor system, making it possible to automate the treatment and ensure high levels of productivity.

The simplicity of these processes has also made it possible to use them for new applications, e.g. to promote adhesion between the copper surfaces of the outer faces of printed circuits (both double-sided and multilayer circuits) and a sheet of polymer resin used to protect the surface of the circuit during the welding stage (the so-called solder mask).

One of these processes is described in European patent application no. 0,792,269, and provides for the use of a composition for the microetching of copper surfaces which comprises $HNO_3$ and/or $H_2SO_4$, $Fe(NO_3)_3$ and/or $Fe_2(SO_4)_3$, and an unsaturated carboxylic acid. This composition is however only capable of ensuring rather limited adhesion between copper surfaces and the polymer resin.

Another process is described in U.S. Pat. No. 4,956,035, and this provides for the use of a composition which includes ferric chloride or peroxysulphuric acid, a cationic surfactant based on quaternary ammonium and a secondary non-ionic surfactant. This composition is in particular used to promote adhesion between the copper surface and a photoresist or a solder mask. This process however is also only capable of ensuring limited adhesion.

Another process is described in U.S. Pat. No. 5,800,859, and this provides for the use of a composition comprising $H_2O_2$, an inorganic acid, a corrosion inhibitor, preferably benzotriazole, and a cationic surfactant, preferably a quaternary ammonium. This process is also only capable of ensuring rather limited adhesion and is not suitable for very critical applications. This process only ensures satisfactory results when it is used to macrocut sheets of copper obtained using a particular technology, marketed under the name DST foil™ by Polyclad Laminates, Inc. This technology makes it possible to obtain high adhesion between the copper sheet and the polymer resin, but has found few applications because it is very costly.

The process described in U.S. Pat. No. 5,800,859 is inspired by an article by Xue et al., published in Die Angewandte Makromolekulare Chemie 188 (1991) 51–61 (No. 3090). This article describes a method for improving adhesion of the epoxy resin on a copper surface by treating the copper surface with a solution based on benzotriazole in the presence of oxygen. A copper surface treated in this way, in hot contact with epoxy compounds, reacts forming chemical bonds at the interface between the two systems.

Another process for promoting adhesion between a copper sheet and a polymer resin is described in U.S. Pat. No. 5,622,782, and this provides for the use of a composition which comprises a mixture of two silanes, comprising an alkoxysilane and a functional organic silane. This process is essentially designed to treat copper sheets used for the production of base laminates, as an alternative to the conventional surface-roughening processes normally performed electrolytically. This treatment is performed on the opaque, that is the rough, surface of the copper sheet. The process described in this patent nevertheless mentions, even if only generically, the possibility of depositing a second layer of adhesion promoter on the bright surface, that is the smooth surface, of the copper sheet. In this case deposition takes place after the stage of etching of the copper, in order to increase adhesion to the sheet of prepreg. This process does not however provide any information about the peel strength values which can be obtained on the bright surface of the copper sheet. In fact, the examples cited in U.S. Pat. No. 5,622,782 relate to treatment performed on the opaque surface of the copper sheet, even though this is not explicitly stated therein. In this patent it is however specified that the process can be used to treat a copper sheet with a surface defined as a "surface having a standard profile", a "surface having a low profile" and "a surface having a very low profile", and in the latter case it is specified that this means a surface having a maximum roughness of 4 microns.

In the manufacture of printed circuits it is necessary to promote adhesion between the bright surface of the copper sheet and the layer of prepreg. In the case of the bright surface, roughness is less than 0.5 microns, and as a consequence adhesion to the sheet of prepreg is very much less than the adhesion obtained with the opaque surface using any kind of treatment. Furthermore, the process described in U.S. Pat. No. 5,622,782 makes it possible to increase adhesion, but does not make it possible to form a deposit of dark brown colour similar to that which is obtained using conventional copper oxide technology. Therefore, and for commercial reasons too, this process has not been accepted by printed circuit manufacturers because it requires long and laborious approval by the final users of the printed circuits.

Another process for the treatment of copper sheet is described in U.S. Pat. No. 5,700,362, and this provides for the formation of a first layer of zinc alloy by electrodeposition onto the bright surface of the copper sheet, and a second layer by immersion in an aqueous solution containing benzotriazole derivatives, phosphorus compounds and even silicon compounds, in particular silanes. Because this process provides for the electrodeposition of alloys, it cannot be applied after the stage of etching the copper. In addition this process is not designed to promote adhesion, but essentially to improve the properties of the copper sheet, such as the resistance of the surface to discolouring when hot, and so on.

The problems mentioned hitherto with reference to the most frequent situation where adhesion between a layer of copper and a layer of polymer resin is considered can also occur in other circumstances where the substrate is generically inorganic.

SUMMARY OF THE INVENTION

This invention relates to a process and composition for promoting adhesion between an inorganic substrate and a layer of polymer resin. More particularly this invention relates to a process and composition for promoting adhesion between a layer of copper or copper alloy and a layer of only partly polymerized polymer resin (prepreg). This process is designed to be conveniently used in the manufacture of multilayer printed circuits. The composition to which this invention relates is capable of depositing a uniform organometallic layer of a dark brown colour, very similar to that which is obtained using the conventional copper oxide technique, onto copper surfaces. Another important feature of this invention is its ability to eliminate the pink ring problem, as the organometallic layer which is obtained by this new process is, unlike copper oxide, insoluble in acids.

This invention is effected through a composition which comprises a mixture of one or more functional organic silanes, an azole compound, a zinc compound, an oxygen carrier and an acid. In some cases it is recommended that before being used the functional organic silane should be subjected to at least partial hydrolysis treatment.

When the only partly polymerized polymer resin sheet is placed in contact with the organometallic layer a complex series of polymerization reactions which act synergistically and which are capable of strongly promoting adhesion between the inorganic substrate and the resin take place at the interface between the two systems under the action of pressure and heat.

In the production of printed circuits the process to which this invention relates can also conveniently be used to promote adhesion between the outer copper surfaces of the circuit and the polymer layer comprising the solder mask. This process can also conveniently be used to promote adhesion between the outer copper surfaces of the circuit and the layer of photosensitive dielectric used in the production of printed circuits using the technology known as build-up technology.

This invention relates to a new process for greatly increasing adhesion between a surface of an inorganic substrate, especially copper or copper alloy (a surface which will for simplicity be described below as the copper surface) and a polymer substrate. An important feature of this invention is that of depositing a perfectly uniform organometallic layer of a dark brown colour similar to that which is obtained with conventional copper oxide technology on a copper surface. This invention finds application especially in the treatment of the copper surfaces of printed circuits, and in particular for treatment of the copper surfaces of the internal layers of multilayer printed circuits. The copper surface which is subjected to treatment in accordance with the process to which this intervention relates is the "bright" surface of the copper sheet. In this case treatment is performed after the stage in which the copper is etched.

This invention can also be conveniently applied to treatment of the external copper surfaces of the printed circuit in order to promote adhesion with the solder mask polymer layer (using screen printing or photography) or with the layer of photosensitive dielectric which is used when using the technology known as build-up technology for the production of multilayer printed circuits.

The composition to which this invention relates deposits a thin organometallic layer on the copper surfaces, which covers the surfaces uniformly. When this deposit is placed in contact with an organic polymer, such as e.g. an epoxy compound, a polymerization reaction takes place at the interface between the two systems which is capable of strongly promoting adhesion and thus preventing possible delamination problems.

Because the organometallic deposit is insoluble in acids, unlike copper oxide, the process to which this invention relates makes it possible to eliminate the pink ring problem completely.

This invention is implemented through a composition which comprises a mixture of one or more functional organic silanes, an azole compound, a zinc compound, an oxygen carrier and an acid. Some of the components present in the composition to which this invention relates are already individually known for their ability to promote adhesion, as will be seen in the earlier description of the state of the art. Surprisingly, however, these act together synergistically in the composition to which this invention relates, and their mixture ensures results which are far superior to those obtained using the compounds individually.

The functional organic silanes used in the composition to which this invention relates have a chemical structure represented by the following general formula:

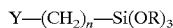

$$Y-(CH_2)_n-Si(OR)_3$$

where: Y represents a functional organic group,
n is a number which has a value between 0 and 3, and
R represents a hydrogen atom or any easily hydrolysable group which is capable of releasing an atom of hydrogen.

Group Y is preferably an amine group, an alkyl-substituted or aryl-substituted amine group, a (straight or branched) alkyl or alkylene chain ending in an amine group, a vinyl group, a glycidoxy group, a mercapto group, a methacrylic group, a nitrile group, an atom of chlorine or a cyano group.

Group R comprises a hydrogen atom or an alkyl group, and is preferably a methyl, ethyl, propyl, isopropyl, butyl, isobutyl, sec-butyl, tert-butyl or acetyl group. Preferably, when R is not a hydrogen atom, the OR groups, by being more active, are hydrolysed so that the radical R is replaced by a hydrogen atom to form one or more OH groups.

The OR group can also initially comprise an atom of chlorine or another functional group which is completely or partly replaced by one or more OH groups during the hydrolysis treatment of the functional organic silane.

DESCRIPTION OF THE PREFERRED EMBODIMENTS

The following compounds are some examples of the silanes which can be used in this invention:

3-aminopropyl-trimethoxysilane, 3-aminopropyl-triethoxysilane, N-aminoethyl-3-aminopropyl-trimethoxysilane, N-methyl-3-aminopropyl-trimethoxysilane, 4-amino-butyl-triethoxysilane, aminoundecyl-trimethoxysilane, 3-glycidoxypropyl-trimethoxysilane, 3-glycidoxypropyl-triethoxysilane, 3-mercaptopropyl-trimethoxysilane, 3-mercaptopropyl-triethoxysilane, mercaptopropyl-methyl-dimethoxysilane, 3-vinylpropyl-trichlorosilane, N-phenylaminopropyl-trimethoxysilane, 3-methacryloxypropyl-trimethoxysilane, 3-chloropropyl-trimethoxysilane, 3-acetoxypropyl-trimethoxysilane, 3-cyanopropyl-triethoxysilane, (N,N-dimethyl-3-aminopropyl)-trimethoxysilane, 3-acryloxypropyl-trichlorosilane, 3-cyanopropyl-trichlorosilane, vinyl-trichlorosilane, vinyl-triethoxysilane.

Before being used in the composition to which this invention relates, the functional organic silanes are preferably subjected to a partial or total hydrolysis treatment. During the hydrolysis treatment the OR groups are partly or completely converted into OH groups which are chemically active and, as will be seen in the remainder of the description of the invention, are capable of chemically bonding with the copper surface and with the azole functional group, thus making it possible to drastically increase adhesion between the inorganic substrate and the polymer layer. Hydrolysis treatment of the functional organic silanes may be performed by merely mixing the silane with water in the presence of an acid and possibly in the presence of a solvent, such as e.g. an alcohol, in order to improve its solubility.

An important contribution to increasing adhesion derives from the reaction between the functional organic group of the Y silane and the organic polymer. For example, when the organic polymer comprises an epoxy resin, it is preferable to use a silane with a functional glycidoxy group. In this case, in fact, cross-linking reactions take place between the two oxysilane groups of the silane and the epoxy resin, which make it possible to anchor the organic polymer to the inorganic substrate.

Silanes with different functional groups have different affinities to the various organic polymers used in the production of printed circuits. Therefore, in the composition to which this invention relates it is preferable to use mixtures of silanes. This makes it possible to conveniently use the composition according to this invention to promote adhesion with the various organic polymers used in the manufacture of printed circuits.

In the composition to which this invention relates the concentration of the silane or mixture of functional organic silanes can vary between 0.01% and 30% by weight. Preferably it lies between 0.1% and 10% by weight, and more preferably it lies between 1% and 5% by weight. The silanes concentration is always expressed as the quantity of unhydrolysed product.

The solubility of some silanes in water may be limited. In order to improve this, it is possible in these cases to optionally use one or more solvents, such as e.g. alcohols. The use of an alcohol may also improve the stability of the silane in aqueous solution, and may also encourage wettability of the metal surface. Of the various alcohols, the use of methanol, ethanol, propanol, butanol and their isomers is preferred. The quantity of alcohol which has to be used varies according to the solubility and quantity of the functional organic silane used.

The composition to which this invention relates comprises a second essential component consisting of an azole compound, preferably selected from an imidazole, a benzimidazole, a triazole or a benzotriazole and their derivatives. Examples of azole compounds which can be used in the composition to which this invention relates are as follows: 1,2,3-triazole, 1,2,4-triazole, 3-methyl-1,2,4-triazole, benzotriazole, tolyltriazole, hydroxybenzotriazole, i-butylbenzotriazole, imidazole, undecylimidazole, benzimidazole, I-methyl benzimidazole.

Benzotriazole and its derivatives obtained by substitution of the aromatic ring with alkyl groups are currently preferred.

As described in the article by Xue et al., cited previously, and as will be more apparent below, the azole compound is easily adsorbed onto copper surfaces and, also because of the bridging bonds produced by the silane, therefore improves adhesion to the epoxy resin. In the composition to which this invention relates, the concentration of azole compound may vary between 0.1% and 10% by weight. Preferably it lies between 0.5% and 5% by weight, and more preferably still it lies between 1% and 3% by weight. The optimum concentration however varies according to the solubility of the azole compound used. Again, for the azole compound, solubility can be increased by using one or more solvents, preferably alcohols.

The composition to which this invention relates may also optionally comprise a zinc compound. The zinc compound may be either inorganic or organic, and is preferably a soluble zinc salt. Examples of zinc salts which can be used are zinc nitrate, zinc sulphate, zinc phosphate, zinc acetate and zinc methane sulphonate. The concentration of the zinc compound may vary between 0.01% and 20% by weight. Preferably it lies between 0.05% and 10% by weight and more preferably still it lies between 0.2% and 2% by weight.

As will be more apparent below, the function of the zinc compound is to permit the formation of coordination complexes between the first layer of azole compound adsorbed onto the copper surfaces and progressively the various subsequent layers of the azole compound, thus making it possible to form a sufficiently thick deposit. The deposit obtained in this way takes on a dark brown colour, which is excellent for use in the manufacture of printed circuits. If the zinc compound were not to be used, the deposit would be characterized by a very much lesser thickness, would be very light in colour and would have a rather non-uniform appearance.

The composition to which this invention relates also comprises an oxygen carrier generally consisting of hydrogen peroxide. Hydrogen peroxide has the function of encouraging adsorption of the azole compound onto the copper surface. In fact, as demonstrated in the cited article by Xue et al., the reaction of adsorption of the first layer of the azole compound (in this case benzotriazole) could not take place if oxygen was absent. In this article it is theorized that in order for the benzotriazole to be adsorbed onto the copper surface a copper benzotriazolate must first form, and this implies that a very thin layer of copper is removed from the metal surface after it has been oxidized by the oxygen. Subsequently the benzotriazole adsorbed onto the copper surface permits the formation of bonds which make it possible to increase the adhesion between the epoxy resin and the copper surface, by reacting with the oxygen ring of the epoxy resin. In the cited article by Xue et al., the possibility of increasing the thickness of the benzotriazole layer on the copper surface in order to achieve an actual deposit of dark brown colour is not however taken into consideration, neither is the possibility of further increasing adhesion through other reaction mechanisms taken into consideration, thus differentiating it substantially from the process according to this invention.

The concentration of hydrogen peroxide in the composition according to this invention must be more than 0.1% by weight, and preferably must be greater than 1% by weight. If the concentration of hydrogen peroxide is too low, excessively long treatment times are required. The hydrogen peroxide concentration must however be less than 5%, and preferably less than 2%, to minimize etching of the copper surface. In fact, the function of the hydrogen peroxide in the process to which this invention relates is not that of microetching the copper surface in order to roughen it, as in conventional microetching processes. On the contrary, its function is to remove the thinnest possible layer of copper in order to permit subsequent deposition of an organometallic layer which is capable of strongly promoting adhesion.

The composition to which this invention relates also comprises an acid which may be either an inorganic or an organic acid. Examples of inorganic acids which can be used are sulphuric acid, phosphoric acid and nitric acid. Examples of organic acids which can be used are acetic acid, methane sulphonic acid, glycolic acid and citric acid. Sulphuric acid is preferably used because this has a very low cost and does not create problems during the stage of the disposal of spent solutions. In the composition to which this invention relates the acid has the dual function of permitting hydrolysis of the silane, which is useful in order to promote adhesion, and of assisting hydrogen peroxide in removing the thin layer of copper from the surface of the substrate.

The concentration of the acid is not particularly critical and can vary between 1% and 40% by weight, and preferably lies between 5% and 15% by weight.

The composition to which this invention relates may comprise an optional component comprising a stabilizer for the hydrogen peroxide which, although present in a small concentration, can decompose rapidly because of the presence of metals in solution. Examples of stabilizers which can be used for this purpose are phenol sulphonic acid, ethylene diamine tetraacetic acid, thioglycolic acid and sodium silicate. The concentration of the stabilizer may vary between 0.001% and 1% by weight, depending on the type of stabilizer used.

The process to which this invention relates is designed to greatly increase bonding between copper surfaces and the layer of polymer resin. This result is achieved, as mentioned previously, through a complex series of reactions which act synergistically and which involve the copper surface, the various functional groups present in the organometallic deposit and the polymer resin. Some of the possible reactions are described below, purely for descriptive purposes.

The functional organic silanes used in the composition to which this invention relates react with water, in the presence of an acid catalyst, hydrolysing and forming silanols in accordance with the following reaction:

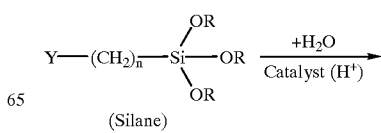

-continued

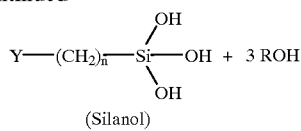
(Silanol)

The silanols thus obtained are capable of giving rise to hydrogen bonds and strong chemical bonds with the surface of the copper. These bonds are obtained through interaction between the silanol and any OH groups which might be present on the metal surface.

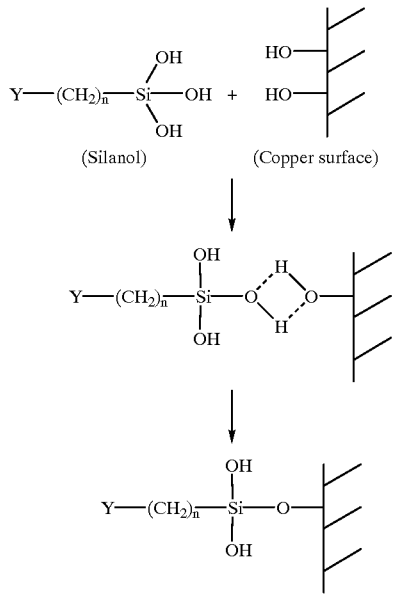

The silanols may also give rise to condensation reactions which involve the hydroxyl groups attached to the silicon atom. These processes give rise to the formation of strong —Si—O—Si— bonds which may involve two or more silanol molecules, as illustrated below:

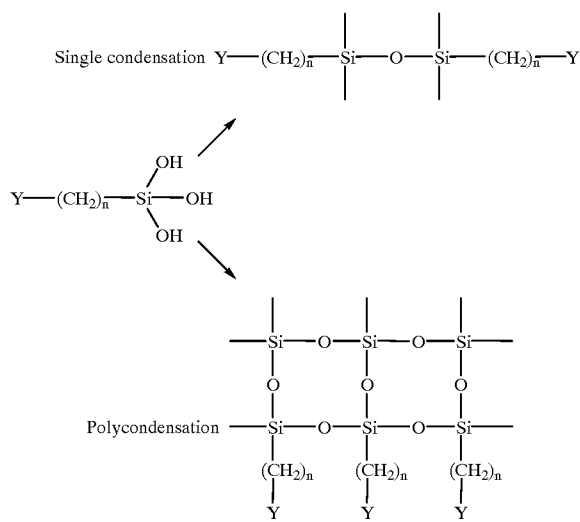

These condensation reactions take place in an uncontrolled way involving most of the hydroxyl functional groups, leading to complete deactivation of the silane with complete loss of its capacity to promote adhesion. Conversely, when only some of the condensate molecules are involved, these make it possible to cross-link such molecules, thus contributing significantly to increasing adhesion.

Azole compounds, and benzotriazole in particular, as well-known in the literature, have a high affinity for metal surfaces, in particular copper, on which they form thin organometallic films. This affinity is due to the nitrogen atoms present in the triazole ring, which are capable of giving rise to strong chemical interactions with copper atoms. In aqueous solution deprotonation of the imine group takes place, giving rise to formation of the benzotriazole anion, making the two pyridine nitrogen atoms equivalent.

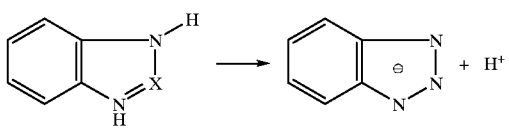

It is through one of these two bonding sites that the benzotriazole is capable of coordinating to the copper forming a polymer film on it.

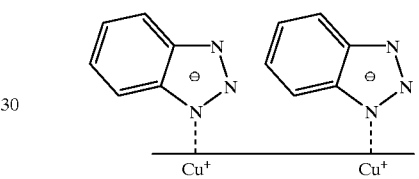

This adsorption only takes place in the presence of oxygen, which is provided by the hydrogen peroxide solution, which by oxidizing and solubilizing a thin layer of copper forms the copper benzotriazolate.

The zinc compound has the function of forming coordination complexes, through bridging bonds, between the benzotriazole molecules fixed on the metal surface and others present in solution. This interaction involves both the pyridine nitrogen atoms of the benzotriazole, as shown below:

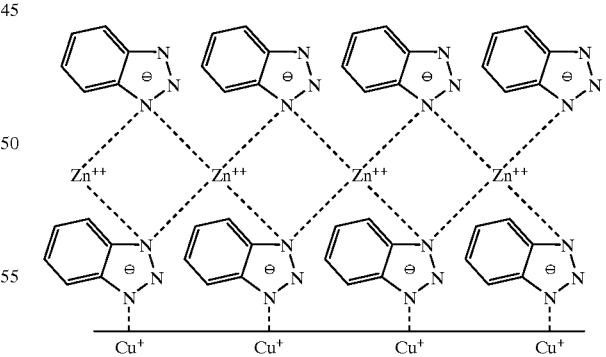

The formation of numerous layers of these coordination complexes results in the creation of an organometallic deposit of some thickness, which not only imparts adhesion upon the polymer resin, but also the dark brown colour on the deposit.

Anionic benzotriazole complexed on the copper surface or coordinated to the zinc is capable of reacting with the epoxy groups present in either the functional organic silanes or the epoxy resin in the layer of prepreg, giving rise to adducts which can subsequently react with other epoxy groups, giving rise to polymerization reactions with the formation of three dimensional cross-linking.

This complex series of reactions which take place at the interface between the metal coated with the organometallic deposit and the epoxy resin makes it possible to achieve a great increase in adhesion between the inorganic substrate and the organic substrate.

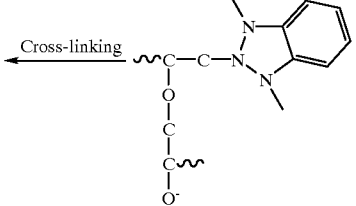

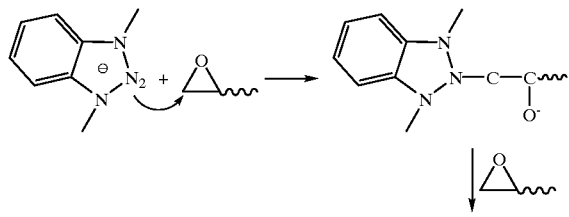

In conclusion, it can be consider that a series of synergistic reactions which involve benzotriazole and functional organosilanes, which interact between each other as just described and with the free epoxy and amine terminal groups on the surface of the epoxy resin, take place at the interface between the metal surface coated with the organometallic film and the organic polymer.

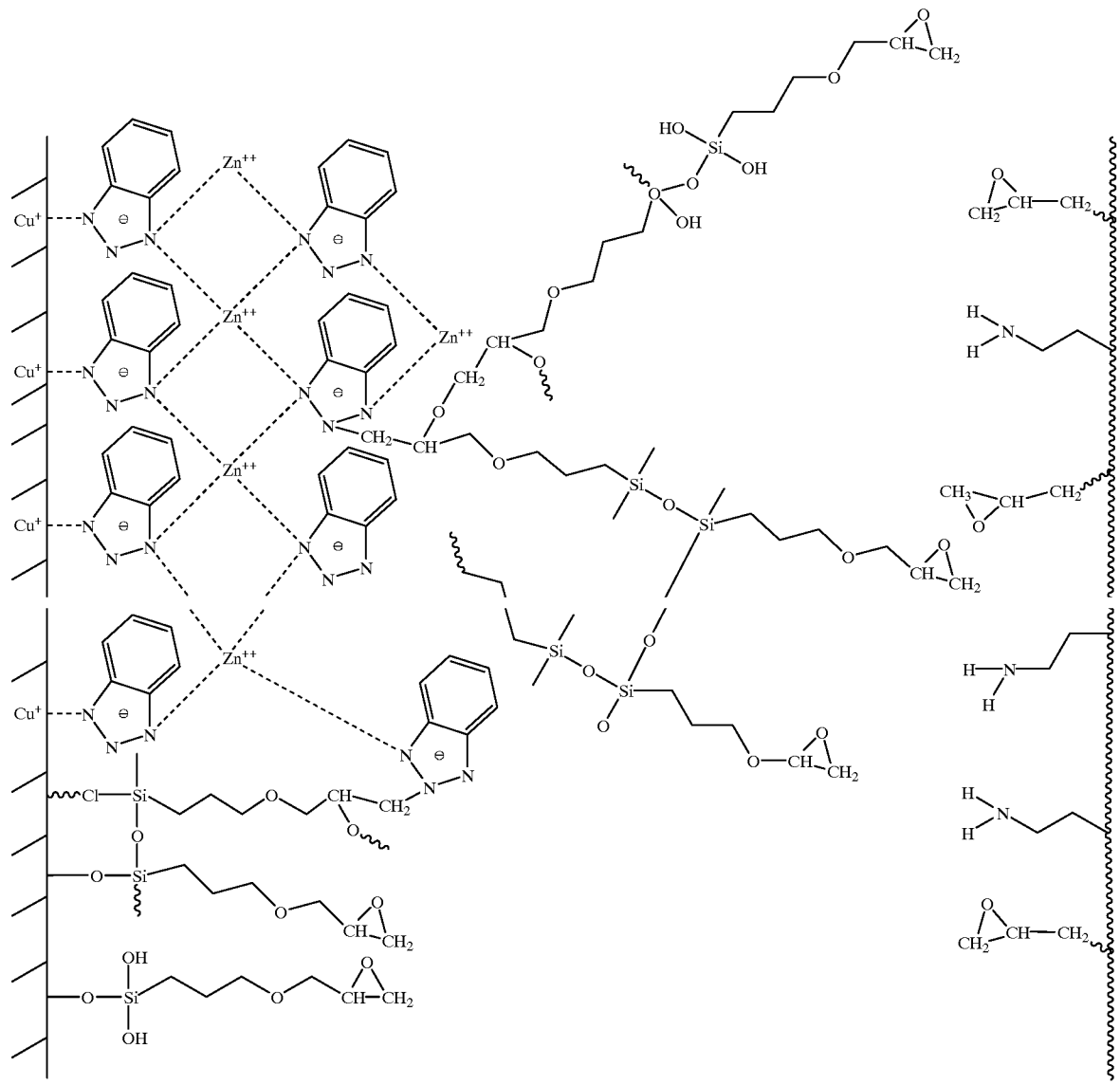

The composition to which this invention relates can be used at a temperature which can vary between 10° C. and 60° C., but preferably lies between 30° C. and 40° C. It is possible to work at lower temperatures, but very long treatment times are required. If working at higher temperatures there is the risk that the copper surface may be excessively etched, and also that the stability of the hydrogen peroxide in the bath may be insufficient.

The treatment time may vary between 15 seconds and 5 minutes, but it is preferably between 1 and 2 minutes.

By working at high temperatures or with very long treatment times and/or with a very high hydrogen peroxide concentration, deposition and subsequent redissolution of the organometallic deposit may occur as a result of the strong microetching action on the copper surface. In this case only microetching of the metal surface will be obtained, as if a conventional microetching process had been used.

The composition to which this invention relates may be used for the treatment of printed circuits using normal methods of application, e.g. by immersion in a tank, by immersion in a module with a conveyor for the horizontal transport of parts, or by spraying.

The copper surfaces to which the layer of organometallic adhesion promoter is applied do not as a rule require any preventive chemical treatment.

However, if oxidation or slight marks are present on the copper surface, preventive treatment in a special alkaline degreasing agent based on monoethanolamine, marketed by Alfachimici under the name Remover DFA 95/LC, is recommended. This product is even capable of removing any dry-film residues present on the copper surfaces.

If on the other hand very heavy marking is present on the copper surfaces, it is recommended that treatment be performed in a degreasing agent based on phosphoric acid, marketed by Alfachimici under the name Cuprolite H 86/1. Neutralization of the copper surfaces in an alkaline degreasing agent, such as e.g. Remover DFA 95/LC or Niclagi 84, both marketed by Alfachimici, is always required after treatment in the acid degreasing agent. Between the various treatments it is always necessary to carry out careful cleaning in water.

As an alternative to preparation of the copper surface by means of chemical treatment it is always possible to perform a preventive mechanical treatment, such as e.g. sanding or satining, before treatment in the adhesion promoter to which this invention relates.

The examples which follow are purely designed to provide a more detailed description of the process according to this invention, without in any way wishing to restrict its scope.

EXAMPLE 1

An aqueous solution comprising the following components, added in the order indicated, is prepared:

|  | % by weight |
| --- | --- |
| Deionized water | 50 |
| 3-aminopropyl-trimethoxysilane | 2 |
| Sulphuric acid | 15 |
| Benzotriazole | 3 |
| Hydrogen peroxide | 2 |
| Zinc sulphate | 1 |
| Phenolsulphonic acid | 1 |
| Deionized water | Up to 100 |

The silane was dissolved in deionized water and hydrolysed in the presence of sulfuric acid, and only then were the other components of the mixture added.

A piece of copper sheet with a thickness of 35 microns was prepared and subjected to preliminary mechanical sanding to remove any oxidation or marks present on the surface. This copper sheet was then treated by immersing it into the above aqueous solution, for 2 minutes at 40° C., with gentle stirring. The copper sheet was then washed and dried. A very uniform and compact organometallic deposit of a dark brown colour was visible on the surfaces of the copper.

The copper sheet treated in this way was laminated onto a rigid substrate, interleaving sheets of bifunctional epoxy resin prepreg at a temperature of 180° C., under a pressure of 20 kg/cm$^2$, for 60 minutes (the side of the copper sheet in contact with the prepreg should be the bright side). The copper sheet was bonded to the prepreg in this way. Strips of known width were made on the surface of the copper by means of a printing and etching process.

The force (peel strength) required to detach the strips of copper sheet from the resin substrate was then measured using a dynamometer. The strips were pulled at an angle of 90°, at a rate of 1 cm/min. A peel strength of 1.4 kg/cm was obtained.

EXAMPLE 2

Internal layers were prepared with a substrate of bifunctional epoxy resin with the pattern printed onto both surfaces. They were then subjected to preventive mechanical sanding treatment and treated by immersing in the same solution as in Example 1, for 2 minutes at 40° C., with the pieces being gently agitated. In this case too a very uniform and compact dark brown deposit was obtained. Afterwards these internal layers were laminated with sheets of bifunctional epoxy resin prepreg under the same conditions as in Example 1. The multilayer packs thus obtained were then drilled and treated in accordance with the conventional technology for the manufacture of multilayer printed circuits. The finished multilayer circuits were inspected using horizontal micro cross sections, and these did not show any pink ring problem in the areas surrounding the holes. These multilayer circuits were then subjected to thermal stressing tests (immersion in tin-lead alloy at a temperature of 288° C. for 10 seconds, repeated 6 times), and again examined using both vertical and horizontal metallographic micro cross sections. No pink ring problems were found around the holes, nor any delamination between the copper surfaces and the epoxy resin. In addition to this, no problems of interrupted copper deposition on the walls of the holes opposite the internal copper layer, problems known as wedge-shaped failures of metal coating (known as wedge-voids), were found. These problems occur when the bonding between the copper surfaces and the resin is insufficient, and as a consequence delamination at the hole walls takes place.

EXAMPLE 1A (COMPARATIVE)

An aqueous solution containing 2% of 3-aminopropyl trimethoxysilane in deionized water was prepared.

A copper sheet 35 microns thick was subjected to preliminary sanding treatment and was then treated in this aqueous solution working in exactly the same way as in Example 1. No coloured organometallic deposit was visible on the surface of the copper.

The copper sheet was then laminated with layers of bifunctional epoxy resin prepreg using the same procedure as in Example 1. In this case a peel strength of 0.8 kg/cm was obtained.

EXAMPLE 1B (COMPARATIVE)

An aqueous solution containing the same components as the solution in Example 1, except for the 3-aminopropyltrimethoxy silane and the zinc sulfate, which were absent, was prepared. A sheet of copper and an internal layer which were treated exactly as in examples 1 and 2 were prepared. After treatment a red-brown coloured deposit, quite light in colour and rather non-uniform, could be seen on the surface of the copper. The peel strength which was obtained in this case was 0.7 kg/cm.

This example shows that absence of the silane and the zinc sulfate from the solution to which this invention relates causes the formation of a lighter and less uniform deposit and a substantial fall in peel strength.

EXAMPLE 3

An aqueous solution containing the same components as in Example 1, except for the zinc sulfate, which was absent, was prepared.

A sheet of copper and an internal layer which were treated with exactly the same procedure as in examples 1 and 2 were prepared. After treatment a red-brown coloured deposit, which was not perfectly uniform, could be seen on the surface of the copper. The peel strength obtained in this case was 1.45 kg/cm. No pink ring problems or wedge voids in the metal coating were to be seen in the multilayer circuit.

This example demonstrates that zinc sulfate is essential in order to obtain a dark brown coloured deposit, but has no effect on adhesion.

EXAMPLE 4

An aqueous solution containing the same components as in Example 1 was prepared, except that 3-aminopropyl-triethoxysilane was used instead of 3-aminopropyl-trimethoxysilane. In this case too the silane was first hydrolysed in water in the presence of sulfuric acid.

A sheet of copper and an internal layer which were treated with exactly the same procedure as in examples 1 and 2 were prepared. After treatment a very uniform and compact organometallic layer of a dark brown colour was to be seen on the surface of the copper. The test for measuring adhesion yielded a peel strength of 1.4 kg/cm. No pink ring problems or wedge voids in the metal coating were to be seen in the finished multilayer circuit.

This example demonstrates that even if two silanes with a different alkyl group are used, the final results are identical because the same silanol is obtained after hydrolysis.

EXAMPLE 5

An aqueous solution comprising the following components, added in the order indicated, was prepared:

|  | % by weight |
| --- | --- |
| Deionized water | 50 |
| 3-glycidoxypropyl-trimethoxysilane | 1 |
| Sulphuric acid | 5 |
| Tolyltriazole | 1 |
| Hydrogen peroxide | 1 |
| Zinc sulphate | 1 |
| Deionized water | Up to 100 |

A sheet of copper and an internal layer which were treated with precisely the same procedure as in Examples 1 and 2 were prepared. After treatment a very uniform and compact organometallic deposit of a dark brown colour was to be seen on the surface of the copper. The peel strength obtained in this case was 1.15 kg/cm. No pink ring problems or wedge voids in the metal coating were to be seen in the finished multilayer circuit.

EXAMPLE 6

An aqueous solution comprising the following components, added in the order indicated, was prepared:

|  | % by weight |
| --- | --- |
| Deionized water | 50 |
| 3-aminopropyl-trimethoxysilane | 1.5 |
| 3-glycidoxypropyl-triethoxysilane | 1 |
| Sulfuric acid | 8 |
| Benzotriazole | 3 |
| Hydrogen peroxide | 1 |
| Zinc sulfate | 2 |
| Phenolsulfonic acid | 1 |
| Deionized water | Up to 100 |

A sheet of copper and an internal layer treated using exactly the same procedure as in examples 1 and 2 was prepared. After treatment a very compact and uniform organometallic deposit of a dark brown colour was to be seen on the surface of the copper. The peel strength obtained in this case was 1.6 kg/cm. No pink ring problems or wedge voids in the metal coating were to be seen in the finished multilayer circuit.

EXAMPLE 7

An aqueous solution having a composition which was precisely identical to that of the solution in Example 6 was prepared. A sheet of copper and an internal layer of copper were treated with this solution, treating them successively using the same procedure as in examples 1 and 2, except that instead of using a bifunctional epoxy resin prepreg a tetrafunctional epoxy resin prepreg was used. In this case a peel strength of 1.2 kg/cm was obtained. No pink ring problems or wedge voids in the metal coating were to be seen in the finished multilayer circuit.

EXAMPLE 8

An aqueous solution having a composition which was precisely the same as that of the solution in Example 6 was prepared. A sheet of copper and a flexible internal layer in polyamide, printed on both surfaces, were treated in this solution. Subsequently they were treated using the same procedure as in Examples 1 and 2, except that a polyamide prepreg was used instead of using a bifunctional epoxy resin prepreg. In this case a peel strength of 0.95 kg/cm, amply sufficient to avoid any delamination problem, was obtained. No pink ring problems or wedge voids in the metal coating were to be seen in the finished multilayer circuit.

EXAMPLE 9

A sheet of copper and an internal layer printed on both surfaces were treated using the same solution as in Example 6, using the same procedure as in Examples 1 and 2, except that treatment was applied by immersion in a module with a conveyor, in which the parts were conveyed horizontally, instead of treatment by immersion in a tank.

After treatment a perfectly uniform and compact organometallic deposit of a dark brown colour was to be seen on the surfaces of the copper. The peel strength obtained in this case was 1.7 kg/cm. No pink ring problems nor wedge voids in the metal coating were to be seen in the finished multilayer circuit.

EXAMPLE 10

A sheet of copper and an internal layer printed on both surfaces were treated with the same solution as in example 6, using the same procedure as in Examples 1 and 2, except that in this case the treatment was by spraying, in a module with a conveyor, with the parts being conveyed horizontally. After treatment a perfectly uniform and compact organometallic deposit of a dark brown colour was to be seen on the surfaces of the copper. The peel strength obtained was 1.55 kg/cm. No pink ring problems or wedge voids in the metal coating were to be seen in the finished multilayer circuit.

EXAMPLE 11

A sheet of copper and an internal layer printed on both surfaces were treated using the same solution as in Example 6 using the same procedure as in Examples 1 and 2, except that to remove marks and oxidation preventive chemical treatment was used in this case instead of preventive mechanical sanding treatment. This treatment was performed by immersing in an acid degreasing agent, marketed by Alfachimici under the name Cuprolite H 86/1, for 3 minutes at 50° C., followed by washing in running water and then by immersion in an alkaline degreasing agent, marketed by Alfachimici under the name Remover DFA 95/LC, which is also capable of removing any dry-film residues from the surface of the copper, for 3 minutes at 45° C., followed by washing in running water.

After treatment in the adhesion promoter an organometallic deposit of a dark brown colour, which was perfectly uniform and compact, was to be seen on the surfaces of the copper. The peel strength obtained in this case was 1.65 kg/cm. No pink ring problems or wedge voids in the metal coating were to be seen in the finished multilayer circuit.

This example demonstrates that the preventive mechanical treatment and the chemical treatment yield precisely the same results.

EXAMPLE 12

Some printed circuits were treated with the same solution as in Example 6 after the stage of stripping the tin/lead alloy in order to promote adhesion between the outer copper surface of the circuits and the solder-mask polymer layer. The treatment was performed by immersion in the solution for 2 minutes at 40° C., followed by careful washing in water and drying. After the treatment an organometallic deposit of a dark brown colour, which was perfectly uniform and very compact, was to be seen on the surfaces of the copper.

The layer of solder mask was applied to the circuits by a screen printing process or by a "fogging" treatment, followed by corresponding printing and development treatments. When the circuits with the layer of solder mask were examined, they did not appear to be distinguishable from the circuits treated in accordance with the conventional technology using copper oxide.

These circuits were then subjected to the subsequent treatments specified by the production cycle, such as the hot deposition of tin/lead alloy onto the surfaces of the copper (hot air solder levelling) or the chemical deposition of nickel and gold. In particular, when chemical nickel and gold are deposited, because this deposition takes place hot (80° C.÷90° C.), problems of delamination of the solder mask frequently occur. However, no delamination problems were to be seen on the circuits treated as described above. These circuits were then subjected to thermal stressing tests as described in Example 2. Again in this case no delamination problems were to be seen.

EXAMPLE 13

The same procedure as in Example 12 was repeated, except that a photosensitive polymer commonly used as a dielectric in the build-up technique was deposited instead of depositing a normal solder mask. After the first layer of photosensitive polymer had been deposited, with corresponding printing and development, the surface of the polymer was metal-coated between the faces of the circuit by depositing copper chemically and electrolytically in order to obtain the connecting holes between the layers. Although a double-sided circuit is used to begin with, a four-layer multilayer circuit is obtained through this technique. At this point the circuits are again subjected to treatment in the solution to promote adhesion, as described in Example 12. A new layer of photosensitive polymer is then applied, if a multilayer with a greater number of layers is to be obtained, or the final solder mask.

The circuits produced using this technique were examined after thermal stressing using metallographic micro cross sections. No problems of delamination between the copper surfaces and the layers of polymer resin or pink ring problems were found.

This invention relates to both the procedure described and the compositions used for implementing this procedure.

It should be noted that, in those cases where a composition is intended to be subjected to hydrolysis of the silanes, this treatment may be part of the composition production procedure, which in this case is marketed in the already hydrolysed state, or instead, the composition may be marketed in the non-hydrolysed state, and in this case hydrolysis treatment of the silanes forms part of the process for promoting adhesion, performed through the use of this composition.

The invention is not limited to the examples described. Various modifications and substitutions using equivalent techniques, which are within the scope of those skilled in the art, can be applied to what has been described without thereby going beyond the spirit of the invention and the scope of this patent.

What is claimed is:

1. Process for promoting adhesion between an inorganic substrate and an organic polymer, wherein an organometallic layer of a dark brown colour, which is very uniform and compact, is deposited on the inorganic substrate by means of treatment in a composition which comprises:

a) a silane or a mixture of functional organic silanes with a structure represented by the following general formula:

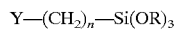

$$Y-(CH_2)_n-Si(OR)_3$$

where: Y represents an functional organic group,
n is a number which has a value between 0 and 3, and
R represents a hydrogen atom or any easily hydrolysable group which is capable of releasing an atom of hydrogen;

b) an azole compound;
c) an oxygen carrier;
d) an organic or inorganic acid.

2. Process according to claim 1, wherein the composition also includes a zinc compound.

3. Process according to claim 1, which also comprises treatment for hydrolysis of the silane or mixture of functional organic silanes.

4. Process according to claim 1, which is performed on an inorganic substrate comprising surfaces of copper or copper alloys.

5. Process according to claim 4, which is used in the manufacture of multilayer printed circuits to promote adhesion between the copper surfaces of an internal layer and a sheet of only partly polymerized polymer resin (prepreg).

6. Process according to claim 5, wherein the polymer substrate of the internal layer and/or the sheet of only partly polymerized polymer resin comprise a resin selected from the group comprising epoxy resin, phenolic resin, polyimide resin, polyamide resin, polyester resin, polyphenylene sulphide resin, polyether imide resin and fluorinated resin.

7. Process according to claim 4, which is used in the manufacture of double-sided or multilayer printed circuits to promote adhesion between the outer copper surfaces of the circuit and the layer of polymer resin constituted by the solder mask.

8. Process according to claim 4, which is used in the manufacture of multilayer printed circuits in accordance with the build-up technique to promote adhesion between the outer copper surfaces of the circuit and the layers of photosensitive dielectric which are subsequently deposited upon them.

9. Process according to claim 4, wherein before treatment with the said composition a preliminary treatment is performed using either mechanical treatment or a chemical procedure with the view to removing oxidation and/or marks or residues from the surfaces of the copper.

10. Process according to claim 4, wherein treatment with the said composition is performed at a temperature of between 10° C. and 60° C.

11. The process according to claim 10, wherein treatment with the said composition is performed at a temperature of between 30° C. and 40° C.

12. Process according to claim 4, wherein the treatment time in the said composition lies between 15 seconds and 15 minutes.

13. The process according to claim 12 wherein treatment time in said composition lies between 1 and 2 minutes.

14. Composition for the deposition of an organometallic layer with a view to promoting adhesion between an inorganic substrate, such as a copper surface of a printed circuit, and an organic polymer layer, which comprises the following components:

a) a silane or a mixture of functional organic silanes with a structure represented by the following general formula:

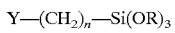

where: Y represents an functional organic group,
n is a number which has a value between 0 and 3, and
R represents a hydrogen atom or any easily hydrolysable group which is capable of releasing an atom of hydrogen;

b) an azole compound;
c) an oxygen carrier;
d) an organic or inorganic acid.

15. Process according to claim 4, wherein treatment in the said composition is performed either by immersion, either in a tank or in a module with a conveyor, or by spraying.

16. Composition according to claim 15, which also contains a zinc compound.

17. Composition according to claim 16, wherein the zinc compound comprises a soluble zinc salt.

18. Composition according to claim 17, wherein the soluble zinc salt comprises zinc nitrate, zinc sulfate, zinc phosphate, zinc acetate or zinc methane sulfonate.

19. Composition according to claim 15, wherein the Y group of the functional organic silane comprises an amine group, an alkyl-substituted or aryl-substituted amine group, a (straight or branched) alkyl or alkylene chain ending in an amine group, a glycidoxy group, a vinyl group, a mercapto group, a methacrylic group, a nitrile group, a chlorine atom or a cyano group.

20. Composition according to claim 16, wherein the concentration of the zinc compound lies between 0.01% and 20% by weight.

21. The process according to claim 20, wherein the concentration of the zinc compound lies between 0.2% and 2% by weight.

22. Composition according to claim 15, wherein the R group of the functional organic silane comprises an atom of hydrogen or an alkyl group.

23. The process according to claim 22, wherein the R group of the functional organic silane comprises a methyl, ethyl, propyl, isopropyl, butyl, isobutyl, sec-butyl, tert-butyl group or an acetyl group.

24. Composition according to claim 15, wherein the functional organic silane comprises 3-aminopropyl-trimethoxy silane, 3-aminopropyl-triethoxysilane, N-aminoethyl-3-aminopropyl-trimethoxysilane, 3-glycidoxypropyl-trimethoxysilane, 3-glycidoxypropyl-triethoxysilane, 3-mercaptopropyl-trimethoxy silane or 3-mercaptopropyl-triethoxysilane.

25. Composition according to claim 24, wherein before use the functional organic silane is subjected to partial or total hydrolysis treatment in the presence of an acid.

26. Composition according to claim 25, which contains a single functional organic silane.

27. Composition according to claim 26, wherein the concentration of the functional organic silane or the mixture of silanes lies between 0.01% and 30% by weight.

28. The process according to claim 27, wherein the concentration of the functional organic silane of the mixture of silanes lies between 1% and 5% by weight.

29. Composition according to claim 25, which comprises a mixture of functional organic silanes.

30. Composition according to claim 15, wherein the azole compound comprises an imidazole, a benzimidazole, a triazole, a benzotriazole or their derivatives.

31. Composition according to claim 15, wherein the azole compound comprises benzotriazole, tolyltriazole, hydroxybenzotriazole or benzimidazole.

32. Composition according to claim 15, wherein the concentration of the azole compound lies between 0.1% and 10% by weight.

33. The process according to claim 32, wherein the concentration of the azole compound lies between 1% and 3% by weight.

34. Composition according to claim 15, wherein the oxygen carrier comprises hydrogen peroxide.

35. Composition according to claim 34, wherein the concentration of the hydrogen peroxide lies between 0.1% and 5%.

36. The process according to claim 35, wherein the concentration of the hydrogen peroxide lies between 1% and 2% by weight.

37. Composition according to claim 15, wherein the acid is selected from the group comprising sulfuric acid, phosphoric acid, nitric acid, methane sulfonic acid, acetic acid, glycolic acid and citric acid.

38. Composition according to claim 15, wherein the concentration of the acid lies between 1% and 40% by weight.

39. The process according to claim 38, wherein the concentration of the acid lies between 5% and 15% by weight.

40. Composition according to claim 15, which also comprises a component comprising a stabilizer for hydrogen peroxide.

* * * * *